United States Patent
Kiridena et al.

(10) Patent No.: US 9,932,079 B2
(45) Date of Patent: Apr. 3, 2018

(54) RECONFIGURABLE VEHICLE MODEL

(71) Applicant: Ford Global Technologies, LLC, Dearborn, MI (US)

(72) Inventors: Vijitha Senaka Kiridena, Ann Arbor, MI (US); Ksenia Kozak, Ann Arbor, MI (US); Nanxin Wang, Novi, MI (US); Jeffrey Allen Greenberg, Ann Arbor, MI (US); Gary Steven Strumolo, Beverly Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/716,372

(22) Filed: May 19, 2015

(65) Prior Publication Data

US 2015/0256816 A1    Sep. 10, 2015

Related U.S. Application Data

(63) Continuation of application No. 11/839,194, filed on Aug. 15, 2007, now Pat. No. 9,070,298.

(51) Int. Cl.
*B62D 65/14* (2006.01)
*B60N 2/02* (2006.01)
(Continued)

(52) U.S. Cl.
CPC .............. *B62D 65/14* (2013.01); *B60N 2/02* (2013.01); *G06F 17/5095* (2013.01); *G09B 9/05* (2013.01)

(58) Field of Classification Search
CPC ........ B62D 65/00; B62D 65/02; B62D 65/14; B62D 63/02; B62D 63/025; B60N 2/02;
(Continued)

(56) References Cited

U.S. PATENT DOCUMENTS

| 5,237,250 A | 8/1993 | Zeile et al. |
| 5,384,704 A | 1/1995 | Snyder et al. |

(Continued)

OTHER PUBLICATIONS

Giacomin et al., "An analysis of human comfort when entering and exiting the rear seat of an automobile", 1997, Elsevier, Applied Ergonomics vol. 28, No. 5/6, pp. 397-406.*

(Continued)

*Primary Examiner* — Spencer D Patton
(74) *Attorney, Agent, or Firm* — Marla Johnston; Brooks Kushman P.C.

(57) ABSTRACT

A vehicle model including main and secondary modules is provided. The vehicle module may also include vehicle components, a frame, a camera system, and a controller. The vehicle components are operably connected to the modules. The frame supports the modules and components and defines a 3D coordinate system including identifiable reference points. The camera system is arranged with the frame to capture activity within the 3D coordinate system. The controller is in communication with, and configured to direct operation of, the modules, components, and camera system based on the identifiable reference points and accessible vehicle CAD data. The vehicle components may comprise a subject platform located adjacent to, detached from, and integrated to function with the modules. The subject platform may be configured to vertically adjust between a plurality of positions for simulating ground outside a vehicle.

17 Claims, 5 Drawing Sheets

(51) Int. Cl.
*G09B 9/05* (2006.01)
*G06F 17/50* (2006.01)

(58) Field of Classification Search
CPC ......... B60R 2300/80; B60R 2300/8006; G06F 17/5095; G09B 9/00; G09B 9/04; G09B 9/042; G09B 25/00; G01M 99/001; G01M 17/00
See application file for complete search history.

(56) References Cited

U.S. PATENT DOCUMENTS

| | | | |
|---|---|---|---|
| 5,732,912 A | 3/1998 | Nomura et al. | |
| 5,774,969 A | 7/1998 | Zuccato | |
| 6,324,750 B1 | 12/2001 | Saunders et al. | |
| 6,371,766 B1* | 4/2002 | Doll | G09B 9/042 434/373 |
| 6,760,693 B1 | 7/2004 | Singh et al. | |
| 7,079,114 B1* | 7/2006 | Smith | G06F 3/0304 345/156 |
| 7,295,959 B2 | 11/2007 | Noma et al. | |
| 7,440,877 B2 | 10/2008 | Smith et al. | |
| 2003/0011561 A1 | 1/2003 | Stewart et al. | |
| 2003/0055674 A1 | 3/2003 | Nishiyama | |
| 2003/0132968 A1 | 7/2003 | Stewart et al. | |
| 2004/0148145 A1 | 7/2004 | Chen et al. | |
| 2005/0096885 A1 | 5/2005 | Rhodes et al. | |
| 2005/0200623 A1 | 9/2005 | Smith et al. | |
| 2005/0238452 A1 | 10/2005 | Botos et al. | |
| 2006/0025983 A1 | 2/2006 | Arbitter et al. | |
| 2006/0038812 A1 | 2/2006 | Warn et al. | |
| 2006/0038832 A1 | 2/2006 | Smith et al. | |
| 2006/0145514 A1 | 7/2006 | Cardwell et al. | |
| 2006/0155402 A1 | 7/2006 | Read | |
| 2007/0156317 A1 | 7/2007 | Breed | |
| 2007/0205573 A1 | 9/2007 | Hallmark | |
| 2009/0048742 A1* | 2/2009 | Kiridena | G09B 9/05 701/49 |

OTHER PUBLICATIONS

Ferrigno et al., "ELITE: A Digital Dedicated Hardware System for Movement Analysis via Real-Time TV Signal Processing," 1985, IEEE Transactions on Biomedical Engineering, vol. BME-32, No. 11, pp. 943-950.*

Ait El Menceur et al., "An Experimental Protocol to Study the Car Ingress/Egress Movement for Elderly and Pathological Population," Sep. 2006, European Annual Conference on Human Decision-Making and Manual Control.

Calkins, D.E. Egging, N. Scholz, C. and Gomez-Levi, G,.: AutoDSS: A System Level KBE Tool for Vehicle Product Definition, SAE 2000-01-1351.

Bhise, V., Kridli G., Mamoola, H., Devaraj, S., Pillari, A., Shulze, R.: Development of a Parametric Model for Advanced Vehicle Design, SAE 2004-01-0381.

Wang, N. Becker, B., and Kaepp, G.: PEDSS: A Product Engineering Decision Support System, Proceedings of IMECE 2000, Florida 2000.

Wang, N. Wan, J., and Gomze-Levi, G.: A Pragmatic Approach to Vehicle Seating Buck Design, ASME DETC200457212.

Wang, N. Wan, J., and Gomze-Levi G.: Parametric Method for Applications in Vehicle Design, SAE 05B-201, accepted by SAE World Congress, Apr. 2005.

"Motor Vehicle Dimensions," SAE International Surface Vehicle Recommended Practice, J1100, Revised Jul. 2002, 68 pages.

Aleixos et al., "Integrated Modeling with Top-Down Approach in Subsidiary Industries," Computers in Industsry, vol. 53 (2004), pp. 97-116.

* cited by examiner

RECONFIGURABLE VEHICLE MODEL

CROSS-REFERENCE TO RELATED APPLICATION

This application is a continuation of application Ser. No. 11/839194 filed Aug. 15, 2007, the disclosure of which is hereby incorporated in its entirety by reference herein.

TECHNICAL FIELD

One aspect of the present disclosure generally relates to a reconfigurable vehicle model.

BACKGROUND

Vehicle models, otherwise referred to as vehicle bucks, have been utilized to conduct studies into human motion relating to vehicles. A vehicle model generally includes moveable parts that can be adjusted to reflect a variety of vehicle packages. A typical study includes the collection of human motion data related to one or more of the modeled vehicle packages.

For example, a vehicle model can be variably adjusted to conduct research into human motion while entering and exiting a vehicle (otherwise referred to as ingress and egress). Vehicle models can also be configured to conduct other human occupant package research studies, including, but not limited to, roominess, vision and reachability. Vehicle models can also be used to conduct human ergonomics studies.

SUMMARY

A vehicle model includes main and secondary modules, vehicle components, a frame, and a camera system. The vehicle components are operably connected to the modules. The frame supports the modules and components and defines a 3D coordinate system including identifiable reference points. The camera system is integrated with the modules and components and arranged with the frame to capture activity within the system. The controller is in communication with the modules and components to direct operation based on the reference points and accessible vehicle CAD data.

A vehicle model includes main and secondary modules and vehicle components. The vehicle components are operably connected to the modules and include a subject platform located adjacent to, detached from, and integrated to function with the modules, and configured to vertically adjust between a plurality of positions for simulating ground outside a vehicle. A frame supports the modules and components and defines a 3D coordinate system including identifiable reference points. A camera system is integrated with the modules and components and arranged with the frame to capture activity within the system. A controller is in communication with the modules and the components to direct operation thereof based on the identifiable reference points and accessible vehicle CAD data.

A method for tracking activity of a vehicle model includes manipulating at least a first and second positionable vehicle module supported by a frame defining a three-dimensional coordinate system including identifiable reference points, manipulating one or more vehicle components operably connected to the modules, positioning one or more cameras of a camera system within the three-dimensional coordinate system to capture reference point locations defined on the modules or components, and initiating a motion capture task in which the camera system captures occupant motion providing data usable to identify occupant effort to enter and exit the vehicle model based on locations of the modules and components.

BRIEF DESCRIPTION OF THE DRAWINGS

The features of the present disclosure which are believed to be novel are set forth with particularity in the appended claims. The present disclosure, both as to its organization and manner of operation, together with further objects and advantages thereof, may best be understood with reference to the following description, taken in connection with the accompanying drawings which:

FIG. 3b depicts an isolated, top view of a detachable mounting feature according to the embodiment shown in FIG. 3a;

FIG. 5b depicts a cross-sectional side view of the vehicle model footprint of FIG. 5a;

DETAILED DESCRIPTION

According to one embodiment of the present disclosure, a reconfigurable vehicle model is disclosed that can be utilized to conduct research into human motion while entering and exiting (otherwise referred to as ingress and egress) a vehicle. The reconfigurable vehicle model of one or more embodiments of the present disclosure can also be utilized to conduct other human occupant research studies, such as, but not limited to interior roominess, vision and reachability.

The vehicle model can include a number of vehicle modules detachably mounted to a number of primary bases. Each of the number of vehicle modules includes a primary base and a number of components supported by the primary base and moveable relative to the primary base. In one embodiment, the number of vehicle modules includes a main module and a secondary module. In certain embodiments, vehicle components and armatures can be referred to collectively as vehicle components.

Figure 1:
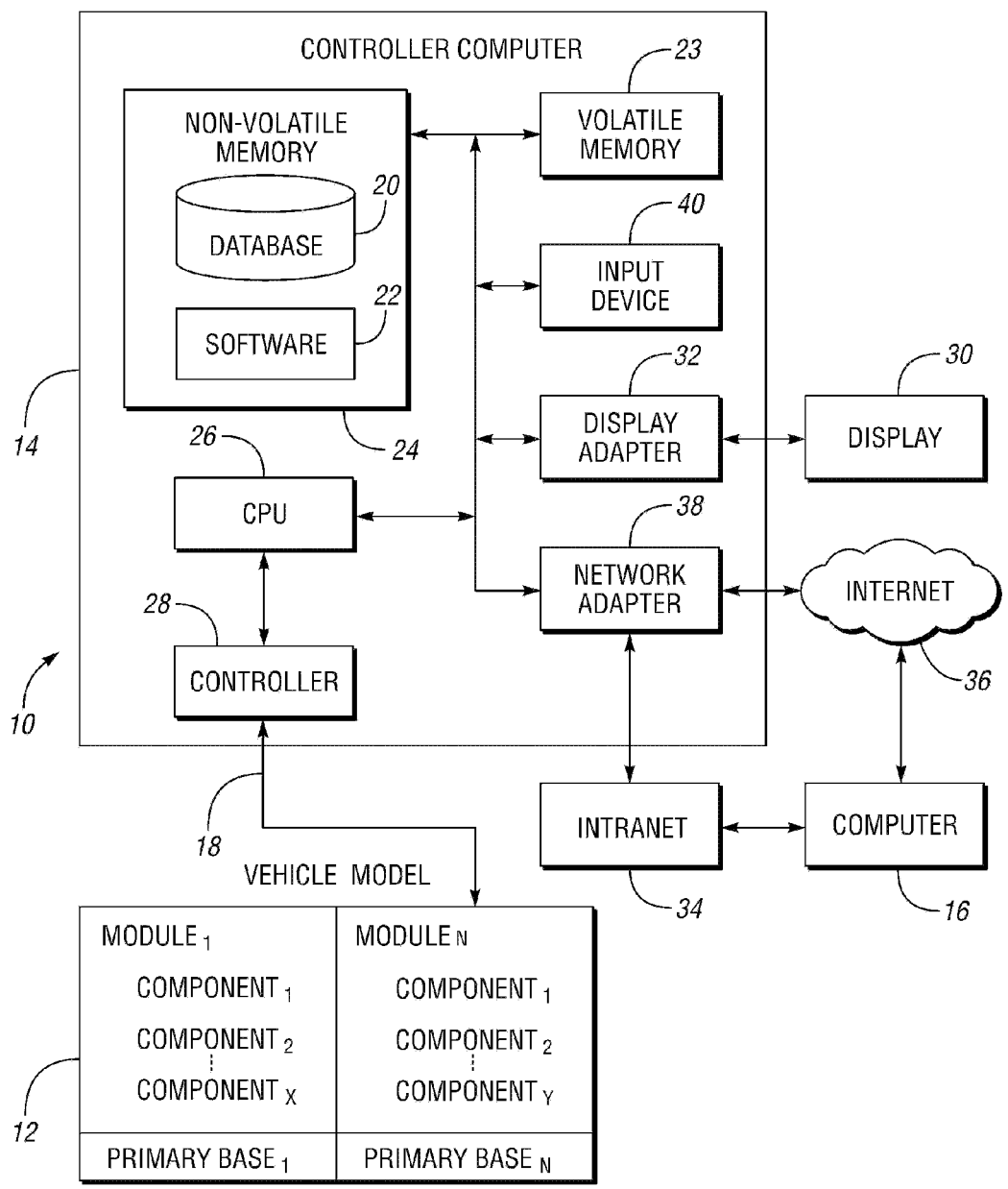
FIG. 1 illustrates a system according to one embodiment of the present disclosure.

The vehicle model thus described can be implemented in combination with a computer system. One example of such a system is disclosed in FIG. 1. FIG. 1 illustrates a system 10 according to the teachings of one embodiment of the present disclosure. The system 10 includes a vehicle model 12, a computer system 14, and a computer 16, for example, a computer aided design (CAD) computer.

Vehicle model 12 includes primary base1 through baseN for supporting module1 through moduleN. Each of the modules includes a set of components, defined as component1, component2 through componentN.

The computer system 14 and the vehicle model 12 can be in two-way electrical communication with each other through communication line 18. Software 22 and database 20 are stored in non-volatile memory 24. Software 22 can be configured to generate machine instructions that are stored in volatile memory 23 and executed by central processing unit (CPU) 26. The machine instructions can include instructions for receiving user input for adjusting the position of one or more components of one or more vehicle modules. The CPU 26 transmits instructions to a controller 28 to electronically adjust the positions of the one or more components via a signal transmitted by the controller 28 through communication line 18 to the vehicle model 12. In at least one embodiment, the controller 28 is capable of adjusting the position of each component from the minimum position to the maximum position within 15 seconds. In other embodiments, the minimum position to maximum position adjustment can be achieved within 10 seconds. In at least one embodiment, the controller can achieve positioning of each component within +/−1.0 millimeter.

The machine instructions generated by software 22 can include instructions for confirming the achievability of a requested component position and for interference checking that may result from the requested position adjustment. The machine instructions can be configured to prevent the controller 28 from actuating one or more components that may result in unachievable positions or interference between components. Controller computer 14 can receive feedback from vehicle model 12 regarding an adjustment command through communication line 18.

The machine instructions of software 22 can be configured to generate one or more control interfaces for display on the display 30 through display adapter 32. The one or more control interfaces available to a user may depend on the one or more vehicle modules that are detachably mounted to the primary base and electronically coupled to the controller 28 through communication line 18. In at least one embodiment, the machine instructions of software 22 can be configured to automatically or semi-automatically enable and disable the available control interfaces when one or more modules are removed and/or added to the system 10.

The machine instructions of software 22 can be configured to transmit and receive text-based commands from computer 16 through an intranet 34 or the Internet 36 through network adapter 38 of controller computer 14. The machine instructions generated by software 22 can be configured to convert incoming text commands into instructions for adjusting the position of one or more components. The machine instructions of software 22 can also be configured to transmit the results of the position adjustment instructions through network adapter 38 to computer 16. In at least one embodiment, the machine instructions generated by software 22 can be configured to initiate position adjustment commands and to receive a response through communication line 18. In at least one embodiment, the text-based commands are prepared in an extended markup language (XML) format. The text-based commands can be based on CAD data or tessellated data of the positions of one or more components of a vehicle model.

The machine instructions of software 22 can be configured to receive input from a user through input device 40. The input can include a definition of the x, y and z positions of one or more components of the vehicle model 12. These positions can be utilized to adjust the position of the one or more components via controller 28. The machine instructions of software 22 can be configured to receive user instructions for moving one or more components in a uniaxially, i.e. x, y or z, direction.

The database 20 can be configured to store a number of position configurations for one or more of the components of a vehicle model. The machine instructions of software 22 can be configured to generate an interface for display on display 30 for allowing the user to select a desired configuration from the stored configurations and to initiate motion of the vehicle 12 based on the selection.

The database 20 can also be configured to store a database of components, component offsets, component sizes and other dimensions to allow a user to modify the component database when different components and trim panels are used.

The machine instructions of software 22 can be configured to couple the movement of two or more components. The movement of the accelerator and steering wheel can be coupled with the primary seat in the y direction. The movement of front header armature can be coupled to the front side roof rail armature in the x and/or y directions. The movement of the rear side roof rail armature can be coupled to the front side roof rail armature in the y and/or z directions.

Figure 2:
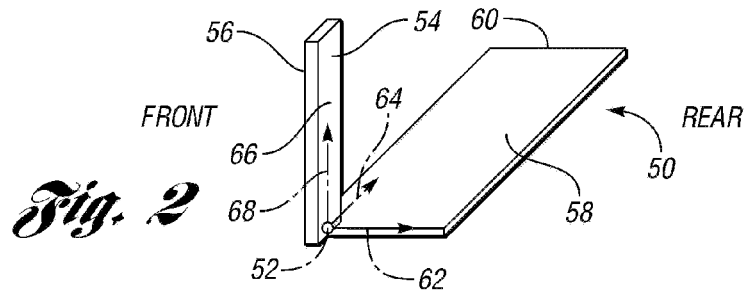
FIG. 2 is an illustration of a datum definition of a vehicle model according to one embodiment of the present disclosure.

FIG. 2 depicts an illustration 50 of a datum definition of a vehicle model according to one embodiment of the present disclosure. The datum definition is utilized for the various embodiments of the present disclosure as set forth herein, although other definitions can be utilized without departing from the scope and spirit of the present disclosure. The datum definition is a single datum point 52 positioned at the intersection of the centerline of the rear face 54 of a front pillar armature 56 and the upper face 58 of the primary floor armature 60.

The single datum point 52 can be represented as (X0,Y0,Z0). The positive X-axis 62 extends from the datum point 52 towards the rear of the primary floor armature 60. The X-axis 62 can be utilized to position and track the fore and aft movement of the vehicle model. The positive Y-axis 64 extends from the datum point 52 towards the inside of the primary floor armature 60. The Y-axis 64 can be utilized to position and track the lateral movement of the vehicle model. The positive Z-axis 66 extends from the datum point 52 orthogonally from the upper face 58 of the primary floor armature 60. The Z-axis 66 can be utilized to position and track the upward and downward movement of the vehicle model.

Figure 3A:
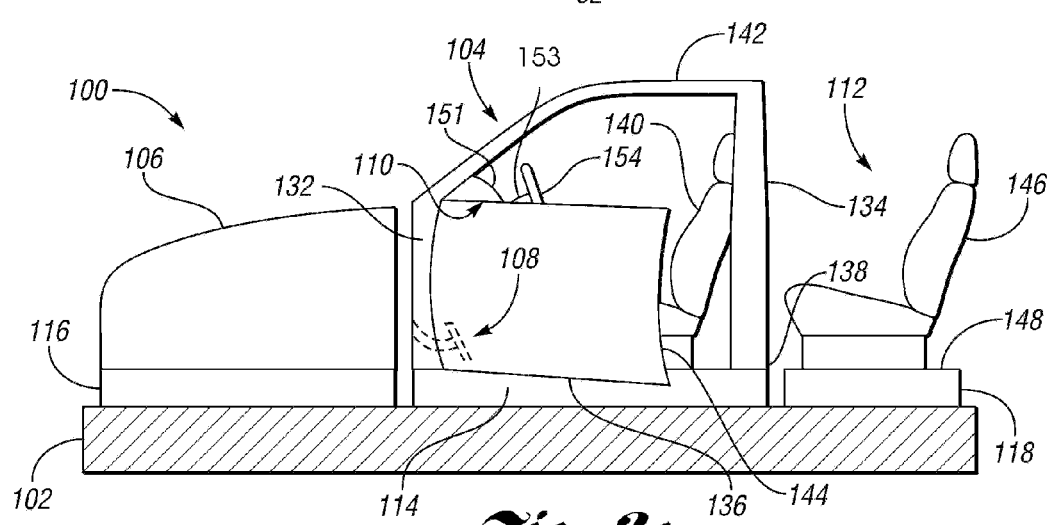
FIG. 3a depicts a side view of a reconfigurable vehicle model according to one embodiment of the present disclosure.

FIG. 3a depicts a side view of a re-configurable vehicle model 100 according to one embodiment of the present disclosure. FIG. 3a illustrates a vehicle model 100 representing a first vehicle row configuration. As shown in FIG. 3a, vehicle model 100 is a quarter vehicle model showing the left side of the first row of a vehicle. It should be appreciated that the embodiments of the present disclosure can be extended to half-vehicle models and full vehicle models. Moreover, the quarter vehicle model can represent the left and/or right side of the second vehicle row or the left and/or right side of a subsequent vehicle row.

The reconfigurable vehicle model 100 generally includes primary base 102, main module 104 and number of secondary modules including hood module 106, pedal module 108, instrument panel module 110, and secondary seat module 112. Main module 104 includes a primary base portion 114 for supporting the main module 104. Hood module 106 includes a primary base portion 116 for supporting the hood module 106. Secondary seat module 112 includes a primary base portion 118 for supporting the secondary seat module 112. In at least one embodiment, the primary base portions 114, 116 and 118 are detachably mounted to the primary base 102 such that the supported modules 104, 106 and 112 are supported by primary base 102 while being easily detached so that the modules 104, 106 and 112 can be reconfigured to represent various vehicle configurations.

Figure 3B:
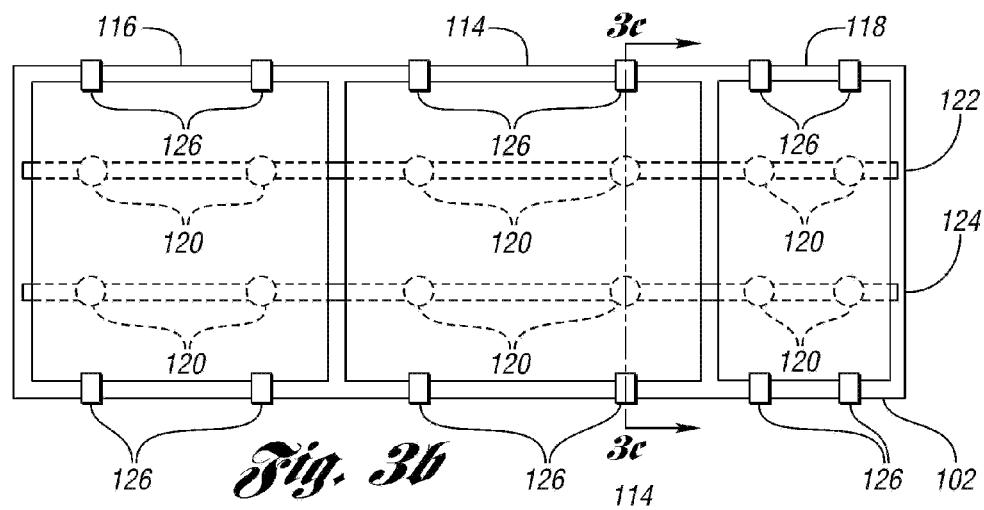
Figure 3C:
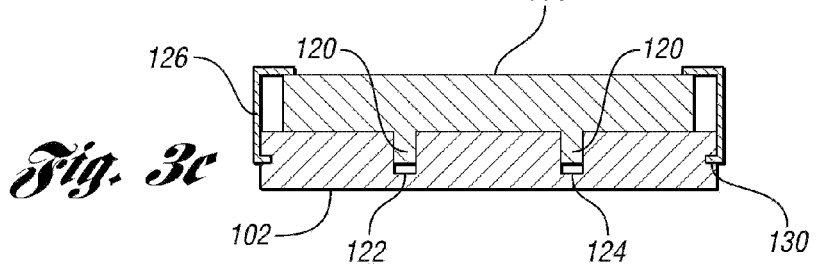
FIG. 3c depicts a cross-sectional side view of the detachable mounting feature shown in FIG. 3b.

FIG. 3b depicts an isolated, top view of the detachable mounting of primary base portions 114, 116 and 118 to the primary base 102 according to one embodiment of the present disclosure. FIG. 3c depicts a cross-sectional side view of the detachable mounting shown in FIG. 3b. Each of the primary base portions 114, 116 and 118 includes a number of projections 120 extending orthogonally downward from the underside of each of the primary base portions 114, 116 and 118. The projections 120 are slidably engaged by either a first longitudinal groove 122 or a second longitudinal groove 124 formed in the primary base 102. The slidable engagement can be utilized to slide the modules on and off of the primary base 102 to reconfigure the vehicle module into different vehicle configurations.

In at least one embodiment, the detachably mounted primary base portions 114, 116 and 118 are anchored to the primary base 102 such that movement between the primary base and the primary base portions during use of the vehicle model is restricted, or even prevented. As shown in FIG. 3b, a number of clamps 126 are utilized to restrict this relative movement. Each clamp 126 contacts a recess 128 formed in the upper surface of one of the primary base portions 114, 116 and 118 and a recess 128 formed in a lateral side of the primary base 102 such that the primary base portion 114, 116 or 118 is held in place relative to the primary base 102 by the contacting force of the clamp 126. It should be appreciated that this is but one non-limiting example of a feature that can be implemented to restrict or even prevent movement of one or more primary base portions relative to the primary base.

The main module 104 includes a number of vehicle components and/or armatures. As used in certain embodiments of the present disclosure, the term vehicle armature refers to a skeletal member of a vehicle model and the term vehicle component refers to components of a vehicle, such as a seat or steering wheel, that are typically affixed to one or more vehicles armatures. In at least one embodiment, vehicle components and/or armatures can be referred to as elements. The main module 104 includes front pillar 132, rear pillar 134, door 136, floor 138, primary seat 140, side roof rails 142, sill (not shown), headliner (not shown), and front header 143, and console 141. In at least one embodiment, the top of each of the front and rear pillars and the front and rear ends of the side roof rails include pivot points to which the upper front pillar and the upper rear pillar are attached. In at least one embodiment, universal joints are affixed at one or more of the pivot points. In one embodiment, universal joints are affixed at all four of the pivot points. Each of the joints is configured for rearward and frontward movement and/or in and out movement of two components coupled by the universal joint.

The door 136 includes an armature frame defining a perimeter 144 of the door 136. The door armature frame can be configured to mount one or more panels that represent the interior trim of a door. In at least one embodiment, the door armature frame is adjustable such that the frame can accommodate a change in height of a beltline (i.e. the height of the front and rear pillars) and the fore-aft position of the rear pillar. In at least one embodiment, this adjustment can be made manually. Additionally, the lower perimeter of the door armature frame can be adjusted to avoid interference with the sill. In at least one embodiment, the door 136 is mounted to the front pillar 132 such that the inner face of the door 136 is aligned with the centerline of the front pillar 132.

The armatures and components of the main module 104 can be a made of a steel alloy or other suitable alloy. In at least one embodiment, suitable materials include such materials that can withstand a vertical load of 300 lbf with minimal plastic deformation and controlled elastic deformation.

Figure 4A:
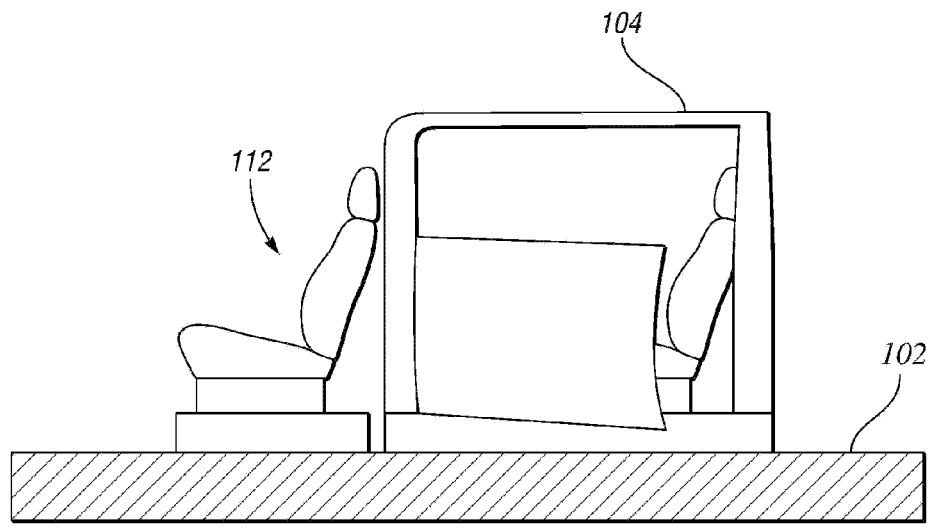
FIG. 4a depicts a side view of a reconfigurable vehicle model according to an embodiment of the present disclosure.
Figure 4B:
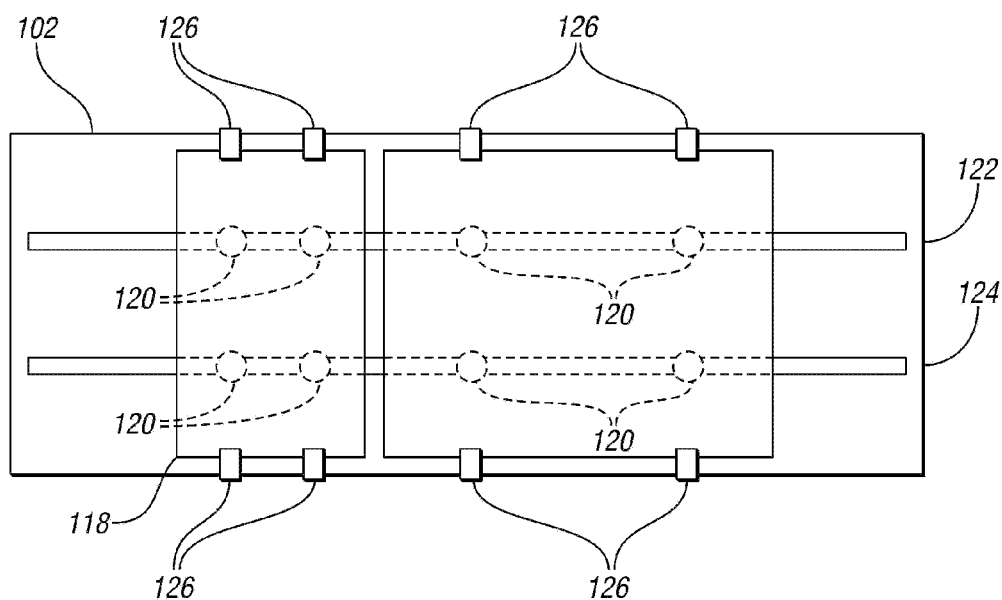
FIG. 4b depicts an isolated, top view of a detachable mounting feature according to the embodiment shown in FIG. 4b.

The secondary seat module 112 includes a seat 146 and a floor 148. The secondary seat module 112 can be detachably mounted to the primary base 102 in front of or to the rear of the main module 104. As depicted in FIG. 4a, the secondary seat module 112 is detachably mounted in front of the main module 104. As depicted in FIG. 3a, the secondary seat module 112 is detachably mounted to the rear of main module 104. According to the configuration shown in FIG. 3a, the secondary seat module 112 represents a second row seat in a two-door vehicle or a third row in a four-door vehicle. According to the configuration shown in FIG. 4a, the secondary seat module 112 represents the first or second row seat and the primary seat 140 represents a second or third row seat, respectively.

The armatures and components of the secondary module 112 can be a made of a steel alloy or other suitable alloy. In at least one embodiment, suitable materials include such materials that can withstand a vertical load of 300 lbf with minimal plastic deformation and controlled elastic deformation.

The instrument panel module 110 includes an instrument panel 151, a steering column 153 and a steering wheel 154. The steering column can be a telescopic steering column. The instrument panel module 110 can be attached to a frontward position within the main module 104. When the instrument panel module 110 is attached to a frontward position within the main module 104, then the main module 104 represents a driver's compartment. In at least one embodiment, the instrument panel module 110 includes an instrument panel armature capable of supporting a full instrument panel.

The pedal module 108 includes an accelerator, brake and clutch. The accelerator may be capable of independent movement in the x, y and z directions and may have the option of being electronically coupled with the movement of the primary seat reference point SgRPy. The movement of the brake and/or accelerator can be coupled to the movement of the accelerator.

The hood module 106 can include a cowl point having motion in the x, y and z directions. In at least one embodiment, the hood angle can be achieved by adjusting the z position of the hood 500 mm from the cowl point in the negative x direction.

In at least one embodiment, the interchangeable modules, i.e. the hood, secondary seat, instrument panel and pedal modules, can be fitted with one or more wheels to facilitate movement and re-configuration. It should be appreciated that other features can be affixed to one or more interchangeable modules to facilitate relatively easy movement and re-configurability.

The seats 140 and 146 can be automotive seats provided by a vendor for integration into the main module 104 and secondary seat module 112, respectively. The primary base portions 114 and 118 can be configured to allow different seats to be easily interchanged without seat-specific mounting fixtures. During ingress/egress testing, the driver actuated seat adjustments remain operational so that the computer system can record feedback regarding the driver selected seat positions.

As shown in FIGS. 3a, 3b, 4a and 4b, the modules are detachably mounted to a primary base. In other embodiments, the ground can support one or more of the modules.

In at least one embodiment, one or more armature elements are formed with a row, rectangular grid or other configuration of holes at a suitable spacing. For example, the hole diameter can be 12 mm and the spacing can be 50 mm. The hole configuration can be utilized to attach one or more panels and/or one or more components to the armature element. According to at least one embodiment, one or more of the armature elements can support trim pieces fabricated from any suitable foam or plastic.

Each of the armature elements can include a reference point, which is represented by a hole on the armature element. Table 1 identifies the reference points of each armature element according to one embodiment of the present disclosure.

Table 2 provides ranges of movement for each of the armature elements according one embodiment of the present disclosure. The ranges are defined as absolute dimensions relative to the reference datum 52. For each armature element, a home position can be defined as a position in which no inference occurs between the elements.

TABLE 2

| Module Name | Armature or Component | X (mm) Min | X (mm) Max | Y (mm) Min | Y (mm) Max | Z (mm) Min | Z (mm) Max |
|---|---|---|---|---|---|---|---|
| Main Module | Floor | | | | | | |
| | Lower front pillar | | | | | 510 | 770 |
| | Lower rear pillar | 790 | 1920 | | | 510 | 770 |
| | Sill | | | −45 | 120 | −65 | 195 |
| | Primary seat | 495 | 920 | 305 | 575 | −135 | 205 |
| | Console | 335 | 920 | 710 | 955 | −5 | 275 |
| | Door | | | | | | |
| | Ground | | | | | −665 | −110 |
| | Headliner | 670 | 1420 | 400 | 875 | 910 | 2210 |
| | Front header | −130 | 620 | 400 | 875 | 860 | 1560 |

TABLE 1

| Module Name | Armature Or Component | Reference Location Definition |
|---|---|---|
| Main Module | Floor | Point on the top face of the floor armature |
| | Lower front pillar | Point on the rear face in x of front pillar armature, on the centerline in y and offset −100 mm in z from the lower front pillar pivot point |
| | Lower rear pillar | Point on the forward face in x of rear pillar armature, on the centerline in y and offset −100 mm in z from lower rear pillar pivot point |
| | Sill | Point on the top face of the sill armature element, along the centerline of the sill armature element in y |
| | Primary seat | Point on the top face of the armature plate at SgRPx and SgRPy |
| | Console | Point on the center (x&y) of the upper face of the console armature |
| | Door | Point on the inside face or the door frame armature. The inside face (in y) is aligned with the centerline (in y) of front pillar armature element |
| | Ground | Point on the top face of the subject platform |
| | Headliner | Point on the center (x, y) lower face of the headliner armature |
| | Front header | Point in the center (x, y) of the lower face of the header armature |
| | Front of siderail | Intersection point of the centerlines (longitudinal axes) of upper front pillar and side roof rail |
| | Rear of siderail | Intersection point of the centerlines (longitudinal axes) of upper rear pillar and side roof rail |
| Secondary Seat Module | Secondary seat (in front position) | Point on the top face of the armature plate at SgRPx and SgRpy |
| | Secondary rear floor | Point on the top face of the floor armature |
| Pedal Module | Accelerator | Point on the center of the accelerator pedal armature |
| IP Module | IP | Left top reference hole on the IP armature attachment fixture |
| | Steering wheel | Pivot point of steering column |
| | Steering column angle | Steering column center line wrt x axis |
| Hood Module | Cowl point | Point in the center (x, y) of the top face of the cowl armature |
| | Hood | Point −500 mm from cowl in the −x direction along the centerline of the hood in the y direction |

TABLE 2-continued

| Module Name | Armature or Component | X (mm) Min | X (mm) Max | Y (mm) Min | Y (mm) Max | Z (mm) Min | Z (mm) Max |
|---|---|---|---|---|---|---|---|
| | Front of siderail | −130 | 620 | 0 | 475 | 870 | 1570 |
| | Rear of siderail | 645 | 2100 | 0 | 475 | 870 | 1570 |
| Secondary Seat Module | Secondary seat (in front position) | −580 | −170 | 285 | 575 | −105 | 240 |
| | Secondary Rear Floor | | | | | −110 | 185 |
| Pedal Module | Accelerator | −275 | −60 | 465 | 650 | 130 | 265 |
| IP Module | IP | −255 | −30 | | | 530 | 680 |
| | Steering Wheel | −135 | 145 | 285 | 595 | 390 | 675 |
| | Steering Column Angle | | | 15 deg | 30 deg | | |
| Hood Module | Cowl point | −585 | −235 | 710 | 955 | 700 | 850 |
| | Hood | | | | | 625 | 905 |

Figure 7:
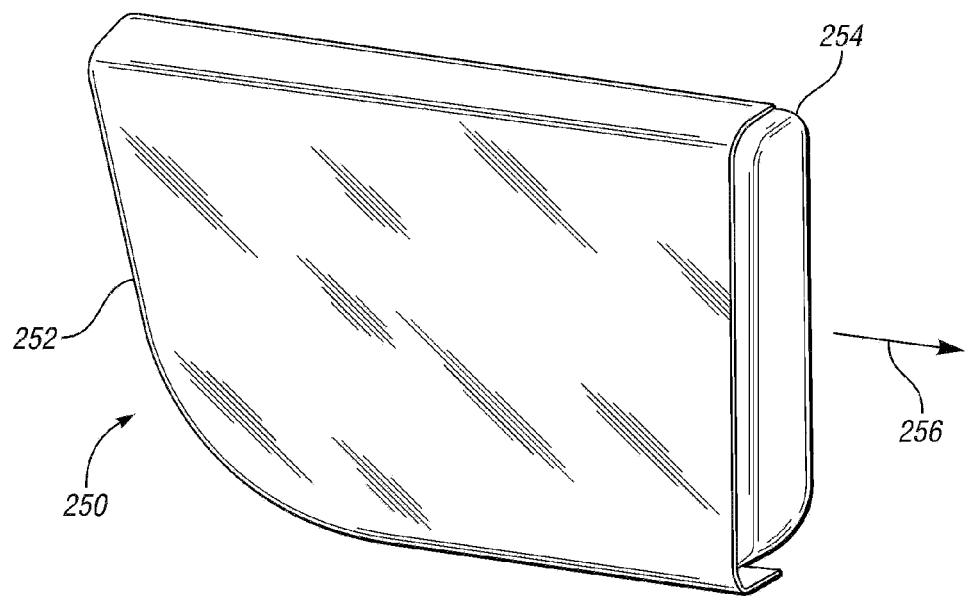
FIG. 7 depicts an example of an overlapping, sliding trim panel according to one embodiment of the present disclosure.

According to at least one embodiment of the present disclosure, one or more components can include overlapping trim panels that can slide over each other to conceal a gap caused by the movement of another component. For example, the main module floor panel can include overlapping trim panels to fill gaps created by seat movement in the x and/or y directions and sill movement in the y direction. As another non-limiting example, the secondary floor panel can include overlapping trim panels to fill gaps created by secondary seat movement in the x and/or y directions. As yet another example, the interior door panel can include overlapping trim panels to fill gaps created by the expansion of the door in response to rear pillar movement in the x and z direction (beltline) and/or sill movement in the z direction. Moreover, the front side roof rail trim can include an overlapping trim panel to fill gaps created by the movement on the rear side roof rail in the x direction. Yet another example includes overlapping sill trim that fills gaps created by the movement of the rear pillar armature in the x direction. In at least one embodiment, the gap-filling feature is limited to a range of two times the minimum size of the trim panel. In at least one embodiment, components without overlapping trim panels can be either fixed components or fixed trim panels. FIG. 7 depicts an example of overlapping, sliding door panel 250 including fixed portion 252 and sliding portion 254 that can slide in direction 256 to change the geometry and dimensions of the panel 250.

The locations and ranges of motion for each of the armature elements as identified in Tables 1 and 2 are derived based on vehicle model dimensions including components and panels.

Figure 5A:
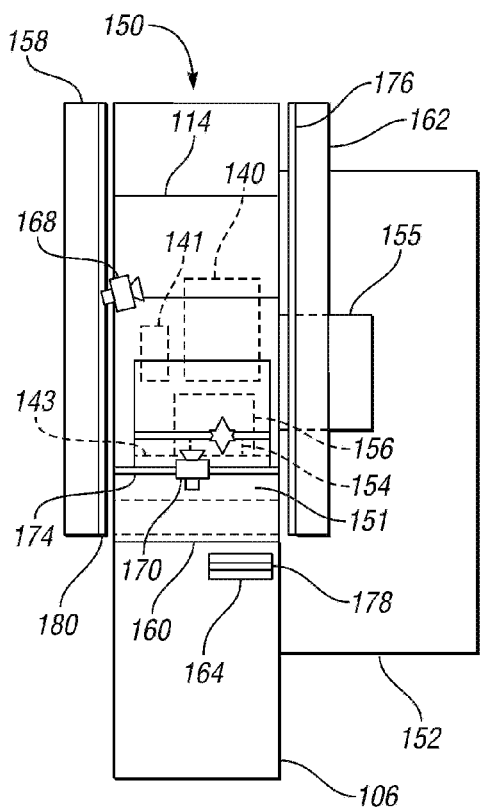
FIG. 5a depicts a top view of a vehicle model footprint according to one embodiment of the present disclosure.
Figure 5B:
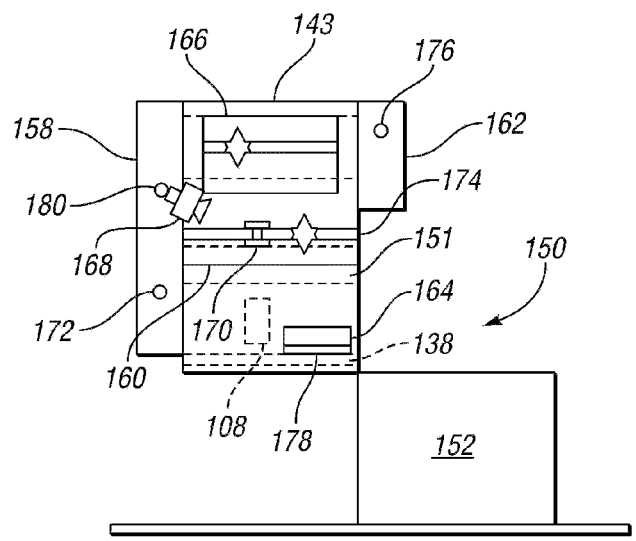

FIG. 5a depicts a top view of a vehicle model footprint 150 according to one embodiment of the present disclosure. FIG. 5b depicts a cross-sectional side view of the vehicle model footprint 150. The footprint 150 includes a subject platform 152 for simulating the ground outside of the vehicle. The subject platform 152 can include rails (not shown) secured to the upper surface perimeter of the subject platform 152. An adjustable canvas curtain can be utilized to cover the sides of the subject platform 152 or any other pinch points. In at least one embodiment, the subject platform 152 has a load capacity of 1200 lbf with minimal plastic deformation and with controlled elastic deformation. According to one embodiment, the size of the subject platform is 1.2 meters in width and 2.8 meters in length.

The subject platform 152 can include a force platform 155 disposed on a portion of the subject platform 152 adjacent to the door opening of the vehicle model. In at least one embodiment, the subject platform 152 is adjustable based on the human ergonomics study being performed. The subject platform 152 can include a cutout to accommodate the force platform 155. The force platform 155 can be utilized to record the force imparted by an occupant's feet as the occupant enters and exits the vehicle model. The force platform 155 can be custom sized, although in at least one embodiment, the force platform 155 is 500 mm in length, 500 mm in width, 44 mm in height and weights 11.4 kg.

The primary base portion 114 can include a force platform 156 positioned in the area of a footwell. The floor 138 can include a cutout to accommodate the force platform 156 such that the force platform 156 can move with the seat 140 in the x and y directions. The force platform 156 can be utilized to record the force imparted by an occupant's feet as the occupant enters and exits the vehicle model. The force platform 156 can be custom sized. In at least one embodiment, the force platform 156 is movable in the x and y directions in combination with the seat 140.

The secondary seating module floor 148 can include a cutout to accommodate a force platform such that the force platform can move with the seat 140 in the fore and aft directions.

Covers can be utilized to conceal the cutouts in the event that the platforms are removed. In at least one embodiment, a conduit can be formed in a side of the cutout to accommodate a cable connecting the force platform to a control box for the force platform. In at least one embodiment, the conduit has a 25 mm diameter.

According to at least one embodiment, a number of a cameras for capturing the motion of occupants are integrated with the vehicle model. This integration aids in the development of digital human models of ingress and egress motion. The motion capture data and/or the force platform data can be utilized to study the joint torques of occupants and thus the overall effort of entering and exiting the vehicle.

As shown in FIGS. 5a and 5b, a number of camera mounting zones 158, 160, 162, 164 and 166 are defined for receiving one or more camera mounting fixtures and one or more cameras. Mounting zone 158 is positioned adjacent to the right side of the occupant when seated in the vehicle model 100. Mounting zone 160 is positioned in front of the header 143 of the vehicle model 100. Mounting zone 162 is positioned adjacent to the left side of the occupant when seated in the vehicle model 100. Mounting zone 164 is positioned adjacent to the footwell of the main module 104. Mounting zone 166 is positioned above the occupant when seated in the vehicle model 100.

Figure 6:
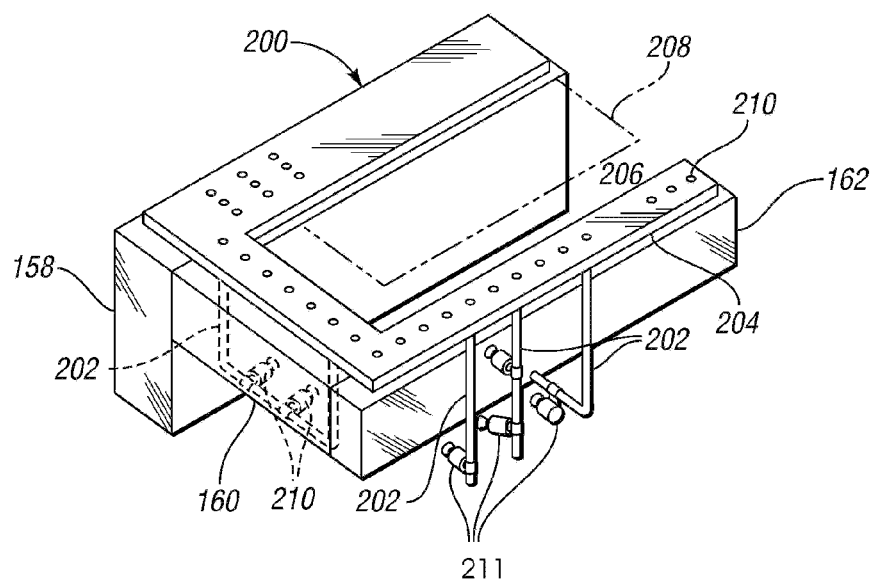
FIG. 6 depicts an example of a camera mounting fixture according to one embodiment of the present disclosure.

FIG. 6 depicts an example of a camera mounting fixture 200, which includes a number of substantially upright rods 202 for supporting a mounting member 204. The mounting member 204 defines an opening 206 for receiving at least a portion of the hood 208 of the main module and/or other components of the main and other modules. A number of threaded holes 210 are formed in mounting member 204 for mounting one or more cameras in a number of locations. Mounting clamps can be utilized to mount the camera to the mounting fixture. In at least one embodiment, the mounting clamps for mounting the cameras to the fixtures are Manfrotto Super Clamps without Stud #2915, available from Gruppo Manfrotto, S.r.l. of Italy. As shown in FIG. 6, mounting fixture 200 can be utilized to mount one or more cameras in mounting zones 158, 160 and 162. The mounting fixture also includes a number of clamps 211 attached to the rods 202 for attaching the mounting fixture 200 to fixed points on the vehicle model 100.

FIG. 6 depicts an example of a vehicle superstructure, i.e. mounting fixture 200, that can be utilized to mount one or more vehicle modules and camera fixtures. In at least one embodiment, the roof of vehicle model is supported by a superstructure, thereby separating the roof from the pillars of the vehicle model.

FIGS. 5a and 5b depict the placement of cameras 168 and 170 within zones 158 and 160, respectively. In at least one embodiment, the cameras are VICON SV Cameras and are 100×60×70 mm in size. Once mounted and calibrated, the cameras remain in a fixed position for the duration of a study and do not move relative to one another even by a few centimeters, according to one embodiment of the present disclosure. Therefore, the mounting fixture for the cameras remain stationary as the components of the vehicle model 100 move to change the vehicle configuration and the positioning of components. The mounting fixture for the cameras provides that the positions of the cameras are relatively stable when exposed to minor disturbances such as vibration or inadvertent bumping by a subject, while the mounting fixture is adjustable independent of the vehicle. This adjustability allows the cameras to be located at desired locations within the camera mounting zones 158, 160, 162, 164 and 166. The adjustability of the camera mounting fixtures can be continuous, meaning that the camera mounting fixtures allow the cameras to be mounted anywhere in the zones, not just at discrete locations. As depicted in FIGS. 5a and 5b, continuous mounting reference lines 172, 174, 176, 178 and 180 are shown for mounting zones 158, 160, 162, 164 and 166, respectively. In at least one embodiment, rod fixtures can be positioned at the mounting reference lines for mounting cameras.

Sightlines from the camera mounting locations to the occupant (both seated occupant and an occupant completing an ingress or egress motion) are clear of obstructions according to one embodiment. Structures other than elements of the vehicle model, such as support structures for the mounting fixture, are not placed in the camera mounting zones according to an embodiment of the present disclosure. In addition, any elements of the vehicle model within the zones can be designed to provide minimal obstruction for the camera sight lines. The position of the overhead camera can be such that the headliner armature and trim can be moved up to their highest position without obstruction from the camera. In at least one embodiment, the vehicle model does not include a roof such that additional camera sight lines can be accommodated.

As required, detailed embodiments of the present disclosure are disclosed herein. However, it is to be understood that the disclosed embodiments are merely exemplary of the disclosure that may be embodied in various and alternative forms. Therefore, specific functional details described herein are not to be interpreted as limiting, but merely as a representative basis for the claims and/or as a representative basis for teaching one of ordinary skill in the art to variously employ the present disclosure.

While the best mode for carrying out the disclosure has been described in detail, those familiar with the art to which this disclosure relates will recognize various alternative designs and embodiments for practicing the disclosure as defined by the following claims.

What is claimed is:

1. A vehicle model comprising:
   main and secondary modules;
   vehicle components operably connected to the modules;
   a frame supporting the modules and components and defining a 3D coordinate system including identifiable reference points;
   a camera system integrated with the modules and components and arranged with the frame to capture activity within the system; and
   a controller in communication with the modules and components to direct operation based on the reference points and accessible vehicle CAD data.

2. The vehicle model of claim 1, wherein the vehicle components comprise a subject platform located adjacent to, detached from, and integrated to function with the modules, and configured to vertically adjust between a plurality of positions for simulating ground outside a vehicle.

3. The vehicle model of claim 1, wherein the frame further comprises mounting zones for the camera system positioned at locations based on the reference points.

4. The vehicle model of claim 1, wherein locations of the identifiable reference points are based on a single datum point identifiable by the camera system.

5. The vehicle model of claim 1, wherein the system is based on a single datum point defined by the frame, modules, or components.

6. The vehicle model of claim 1, wherein the activity comprises human movement within the system.

7. The vehicle model of claim 1, wherein the camera system and frame are further arranged with one another such that one or more cameras of the camera system have a clear line of site to the activity.

8. A vehicle model comprising:
   main and secondary modules;
   vehicle components operably connected to the modules and including a subject platform located adjacent to, detached from, and integrated to function with the modules, and configured to vertically adjust between a plurality of positions for simulating ground outside a vehicle;
   a frame supporting the modules and components and defining a 3D coordinate system including identifiable reference points;
   a camera system integrated with the modules and components and arranged with the frame to capture activity within the system; and
   a controller in communication with the modules and the components to direct operation thereof based on the identifiable reference points and accessible vehicle CAD data.

9. The vehicle model of claim 8, wherein the frame further comprises mounting zones for the camera system positioned at locations based on the reference points.

10. The vehicle model of claim 8, wherein the identifiable reference points are based on a single datum point identifiable by the camera system.

11. The vehicle model of claim 8, wherein the system is based on a single datum point defined by the frame, modules, or components.

12. The vehicle model of claim 8, wherein the camera system and frame are further arranged with one another such that one or more cameras of the camera system have a clear line of site to the activity.

13. A method for tracking activity of a vehicle model comprising:

manipulating at least a first and second positionable vehicle module supported by a frame defining a three-dimensional coordinate system including identifiable reference points;

manipulating one or more vehicle components operably connected to the modules;

positioning one or more cameras of a camera system within the three-dimensional coordinate system to capture reference point locations defined on the modules or components; and initiating a motion capture task in which the camera system captures occupant motion providing data usable to identify occupant effort to enter and exit the vehicle model based on locations of the modules and components.

14. The method of claim 13, further comprising manipulating a subject platform of the one or more vehicle components to simulate ground outside a vehicle.

15. The method of claim 14, further comprising for at least one of a plurality of module configurations, having a human enter and exit the vehicle model; and capturing, using the one or more cameras, the motion of the human as the human enters and exits the vehicle model.

16. The method of claim 13, further comprising manipulating the one or more vehicle components based on accessed vehicle CAD data.

17. The method of claim 16, further comprising accessing trim panel data from the vehicle CAD data and manipulating a position of a trim panel of the one or more vehicle components based on the trim panel data.

* * * * *